(12) United States Patent
Ryu

(10) Patent No.: US 7,018,921 B2
(45) Date of Patent: Mar. 28, 2006

(54) METHOD OF FORMING METAL LINE IN SEMICONDUCTOR DEVICE

(75) Inventor: Sang Wook Ryu, Cheongjoo-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 142 days.

(21) Appl. No.: 10/724,093

(22) Filed: Dec. 1, 2003

(65) Prior Publication Data
US 2005/0009321 A1    Jan. 13, 2005

(30) Foreign Application Priority Data
Jul. 11, 2003    (KR)    .................. 10-2003-0047117

(51) Int. Cl.
*H01L 21/4763*    (2006.01)
(52) U.S. Cl. ...................... 438/637; 438/675
(58) Field of Classification Search ................ 438/618, 438/622, 637, 640, 672, 675
See application file for complete search history.

(56) References Cited

U.S. PATENT DOCUMENTS

| 6,133,139 | A | 10/2000 | Dalal et al. |
| 6,143,602 | A | 11/2000 | Jang |
| 6,303,486 | B1 * | 10/2001 | Park .......................... 438/618 |
| 6,350,672 | B1 * | 2/2002 | Sun .............................. 438/619 |
| 6,376,366 | B1 * | 4/2002 | Lin et al. .................... 438/637 |
| 6,387,287 | B1 | 5/2002 | Hung et al. |

* cited by examiner

*Primary Examiner*—Chandra Chaudhari
(74) *Attorney, Agent, or Firm*—Mayer, Brown, Rowe & Maw LLP

(57) ABSTRACT

The present invention relates to a method of forming a metal line in a semiconductor device, in which an etch-stopping layer is deposited between the interlayer insulation films and then over-etching is performed by using the etch-stopping layer as an etching barrier during the etching process for forming the subsequent trenches. Therefore, it is possible to restrain occurrence of parasitic spacers in the trenches.

4 Claims, 4 Drawing Sheets

METHOD OF FORMING METAL LINE IN SEMICONDUCTOR DEVICE

BACKGROUND

1. Field of the Invention

The present invention relates to a method of forming a metal line in a semiconductor device and, more particularly, to a method of forming a metal line in a semiconductor device capable of preventing reduction of contact areas due to parasitic spacers between metal plugs and metal lines, thereby improving contact resistance between them.

2. Discussion of Related Art

In a semiconductor device or electronic device, a metal line formation technology has been established and widely used. The metal line formation technology includes deposition of a conductive layer including materials such as aluminum (Al) and tungsten (W) on an insulating layer and patterning of the conductive layer by a typical photolithography process and a dry etching process. Particularly, with respect to the logic device requiring high integration and high performance among semiconductor devices, researches and developments in recent years have been focused on a method, which uses copper (Cu) instead of Al or W in order to reduce RC delay. In the aforementioned "RC", the "R" means resistance of a line, and the "C" means dielectric constant of an insulating film.

In the metal line formation process using Cu, patterning becomes more difficult than in the process using Al or W. For this reason, trenches are formed first and then metal lines are formed to bury the trenches. This is called a damascene process. The process widely used at the present time includes a single damascene process and a dual damascene process. According to the single Damascene process, via holes are formed and buried with a conductive material, line trenches are formed on top of it, and then the trenches are buried with a line material again to form metal line. According to the dual Damascene process, via holes and line trenches are formed, and then the via holes and the line trenches are simultaneously buried with a line material to form metal line. Besides, a variety of methods have been proposed.

Meanwhile, it has been known that copper is very rapidly diffused through interstitial sites in silicon so that characteristics such as leakage current, threshold voltage, and saturation current can be deteriorated. For this reason, a copper layer cannot be used for a plug for making contact with a silicon substrate in a metal contact process. Therefore, a planarization process is performed by using a chemical mechanical polishing (CMP) method after contact holes for a metal contact are buried with tungsten plugs. As described above, if tungsten plugs are used to form a metal contact, parasitic spacers (in the circle shown in FIG. 7) occur between tungsten plugs and copper lines. This results in reducing contact areas, increasing resistance of lines, and decreasing reliability of lines. Furthermore, considering effects of line-end-shorting in the line trenches and an overlay margin of an exposure apparatus of 30 nm or more, it is easy to detect them by using technologies of 0.13 μm or less.

SUMMARY OF THE INVENTION

Accordingly, the present invention is directed to provide a method of forming a metal line in a semiconductor device capable of preventing reduction of contact areas due to parasitic spacers between metal plugs and metal lines, and thus improving contact resistance between them.

One aspect of the present invention is to provide a method of forming a metal line in a semiconductor device, comprising the steps of: sequentially forming a first interlayer insulation film, an etch-stopping layer, and a second interlayer insulation film on a semiconductor substrate having a predetermined semiconductor structural layer; forming a contact hole which partially exposes the semiconductor structural layer by performing an etching process using an etching mask for the contact hole; forming a metal plug to bury the contact hole; sequentially forming an anti-diffusion film and a third interlayer insulation film on the whole structure; performing an etching process using an etching mask for a trench to form the trench in such a way that the second interlayer insulation film is over-etched by using the etch-stopping layer as an etching barrier; and forming a metal line to bury the trench.

In the aforementioned of a method of forming a metal line in a semiconductor device according to another embodiment of the present invention, the etch-stopping layer is composed of SiC, SiN, or SiON.

In the aforementioned of a method of forming a metal line in a semiconductor device according to another embodiment of the present invention, the first interlayer insulation film and the second interlayer insulation film are formed by depositing BPSG, PSG, USG, or FSG, or by a film in which fluorine, hydrogen, boron, or phosphorous is locally diffused into SiO or $SiO_2$ in a substitutional or interstitial manner.

In the aforementioned of a method of forming a metal line in a semiconductor device according to another embodiment of the present invention, the etching process is performed by using a $C_xH_yF_z$ gas (x, y, and z are 0 or any natural number) as a main etchant gas and an inert gaseous atom or a molecule of $O_2$, $N_2$, $SF_6$, Ar, or He as an additive gas.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
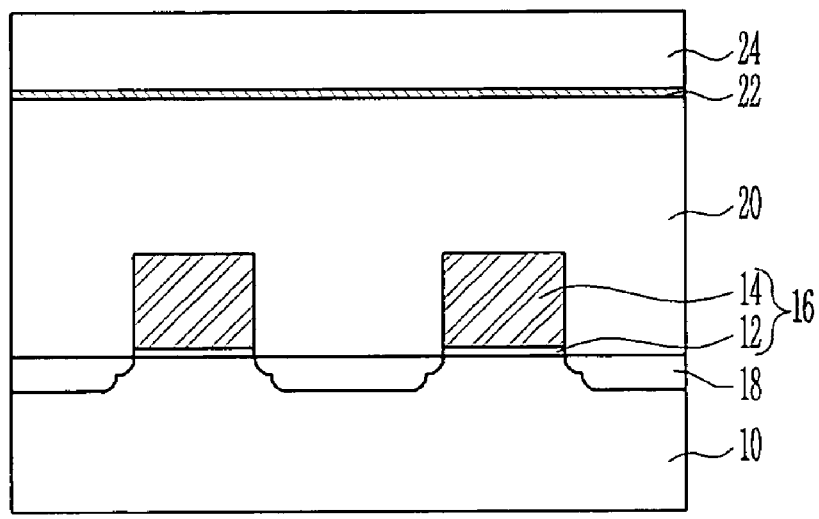
FIGS. 1 to 6 are cross-sectional views for explaining a method of forming metal line in a semiconductor device according to a preferred embodiment of the present invention.

The present invention will be described in detail by way of the preferred embodiment with reference to the accompanying drawings, in which like reference numerals are used to identify the same or similar parts.

FIGS. 1 to 6 are cross-sectional views for explaining a method of forming metal line in a semiconductor device according to a preferred embodiment of the present invention.

Referring to FIG. 1, a semiconductor substrate 10 is prepared to have a semiconductor structural layer (not shown), which includes various well areas and ion implantation areas for a threshold voltage. Subsequently, a gate oxide film 12, a poly-silicon film 14, and a metal silicide layer (e.g., a tungsten silicide layer; not shown) are deposited on top of the whole structure in a sequential manner and then patterned to form gate electrode 16. Then, lightly doped drain (LDD) spacers are formed on both side walls of the gate electrodes 16. Subsequently, an ion implantation process for a source/drain is performed to form source/drain areas 18 on the exposed portions of the semiconductor substrate 10 in both sides of the gate electrode 16. As a consequence, a transistor including the gate electrode 16 and the source/drain area 18 is formed.

After the transistor is formed, a first interlayer insulation film 20 is formed on top of the whole structure. In this case, in order to reduce height differences of steps generated by the gate electrode 16 and planarize its surface, the first interlayer insulation film 20 is formed by, as a first step, depositing boron phosphorous silicate glass (BPSG), phosphorous silicate glass (PSG), un-doped silicate glass (USG), or fluorinated silicate glass (FSG), etc., or by a film in which fluorine, hydrogen, boron, or phosphorous is locally diffused into SiO or $SiO_2$ in a substitutional or interstitial manner, and then, as a second step, depositing an oxide film such as chemical vapor deposition—tetraethylorthosilicate (CVD-TEOS) or plasma enhanced CVD-TEOS (PECVD-TEOS) on top of it. Herein, the first interlayer insulation film 20 has a thickness of 3,000 to 9,000 Å. In a subsequent step, the fist interlayer insulation film 20 may be planarized by using a CMP process.

After the first interlayer insulation film 20 is formed, an etch-stopping layer 22 is formed on top of the whole structure. In this case, the etch-stopping layer 22 can be made up of SiC, SiN, or SiON. Herein, the etch-stopping layer 22 is deposited to have a thickness of 50 to 1,000 Å. Then, a second interlayer insulation film 24 is deposited on the etch-stopping layer 22. Also, the second interlayer insulation film 24 is formed by depositing BPSG, PSG, USG, or FSG, etc., or by a film in which fluorine, hydrogen, boron, or phosphorous is locally diffused into SiO or $SiO_2$ in a substitutional or interstitial manner. Herein, the second interlayer insulation film 24 is deposited to have a thickness of 50 to 3,000 Å. In a subsequent step, the second interlayer insulation film 24 may be planarized by using a CMP process.

Figure 2:
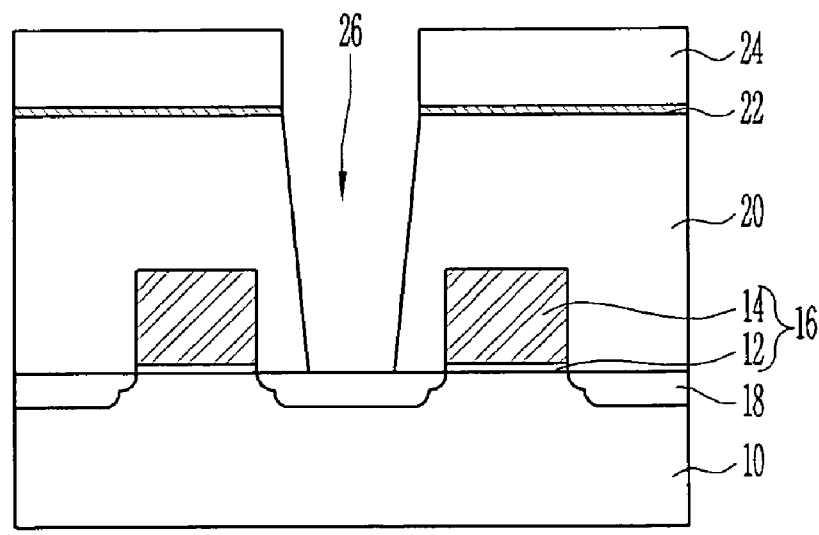

Referring to FIG. 2, a photoresist is coated on the entire top surface of the whole structure. Then, an exposure process and a development process are sequentially performed by using photo masks to form a photoresist pattern (not shown) as a mask for forming contact holes by which the second interlayer insulation film 24 is partially exposed. Subsequently, a dry etching process is performed by using the photoresist pattern as an etching mask to expose and pattern the second interlayer insulation film 24, the etch-stopping layer 22, and the first interlayer insulation film 20 in a sequential manner. As a result, a contact hole 26 is formed to expose the source/drain area 18. In this case, $C_xH_yF_z$ (x, y, and z are 0 or any natural number) gases are used as main etchant gases in the etching process, and inert gaseous atoms or molecules such as $O_2$, $N_2$, $SF_6$, Ar, or He are used as additive gases. When it is necessary to lower selectivity for the etch-stopping layer 22, a proportion of C/F can be reduced, that is, the amount of the additive gases can be increased. In other words, in the $C_xH_yF_z$, a proportion of 'x' can be reduced, or a proportion of 'z' can be increased. In addition, it is possible to perform dry etching for an etch-stopping layer 22 and interlayer insulation films 20 and 24 in a multi-staged manner by adjusting the aforementioned proportion of C/F. After that, the photoresist pattern is removed by a stripping process. In addition, a cleaning process may be performed.

Figure 3:
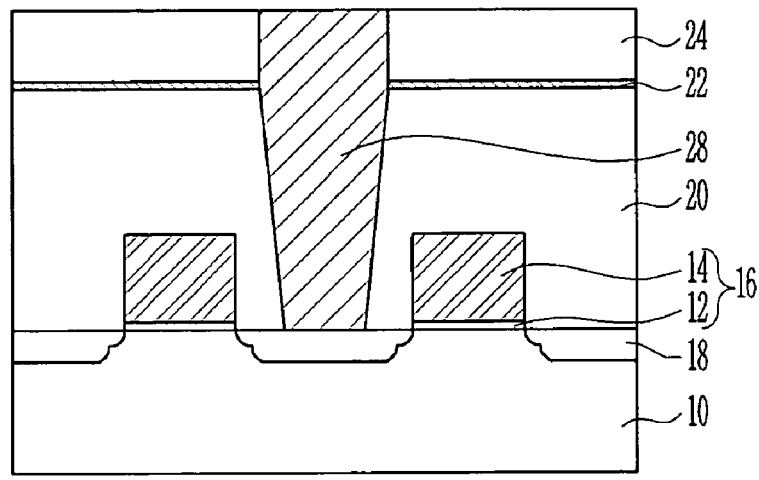

Referring to FIG. 3, a first barrier film (not shown) is formed after the contact hole 26 is formed as shown in the FIG. 2. The first barrier film functions as a glue layer and an anti-diffusion layer. In this case, the first barrier film can be a single-layered film made up of one material selected from a group of materials consisting of Ta, TaN, TaAlN, TaSiN, $TaSi_2$, Ti, TiN, TiSiN, WN, Co, and $CoSi_2$, or a double-layered film laminated by using the above materials. Then, a metallic material (not shown) is deposited to bury the contact hole. Subsequently, instead of a CMP process, an etch-back process is performed to form a metal plug 28 in such a way that a dry etching process is performed by using $SF_6/Cl_2/BCl_3$ or the like as main etchant gases and $O_2$, $N_2$, Ar, He, or the like as additive gases. In this case, the metal plug 28 is made up of tungsten, aluminum, or other metallic materials. Preferably, tungsten is used.

Figure 4:
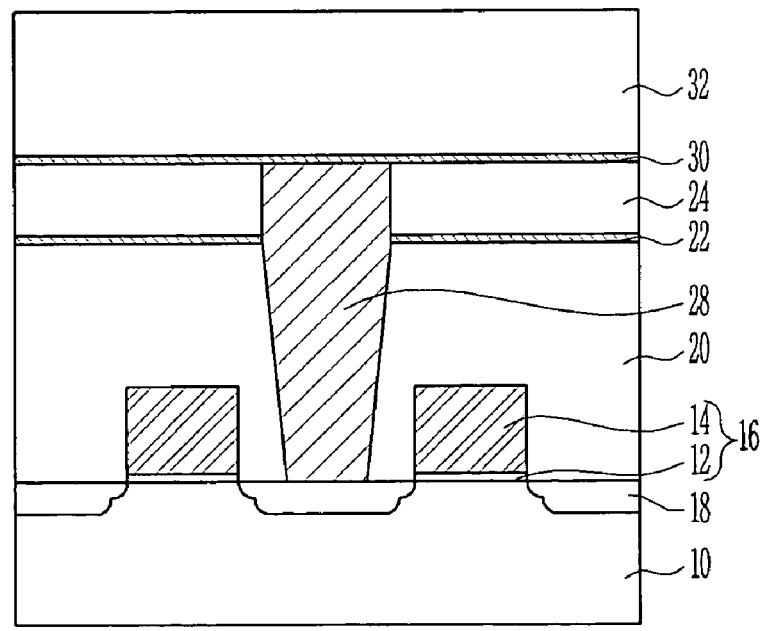

Referring to FIG. 4, an anti-diffusion film 30 is formed on top of the whole structure after the metal plug 28 is formed as shown in FIG. 3. In this case, the anti-diffusion film 30 is made up of SiON, SiN, or SiC. Then, a third interlayer insulation film 32 is formed on the anti-diffusion film 30. The third interlayer insulation film 32 is formed by depositing BPSG, PSG, USG, or FSG, etc., or by a film in which fluorine, hydrogen, boron, or phosphorous is locally diffused into SiO or $SiO_2$ in a substitutional or interstitial manner.

Figure 5:
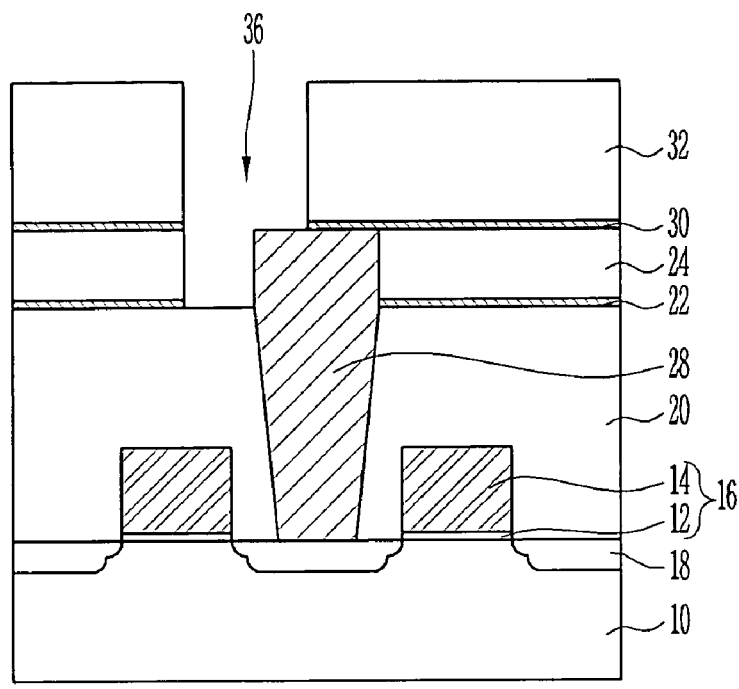
Figure 7:
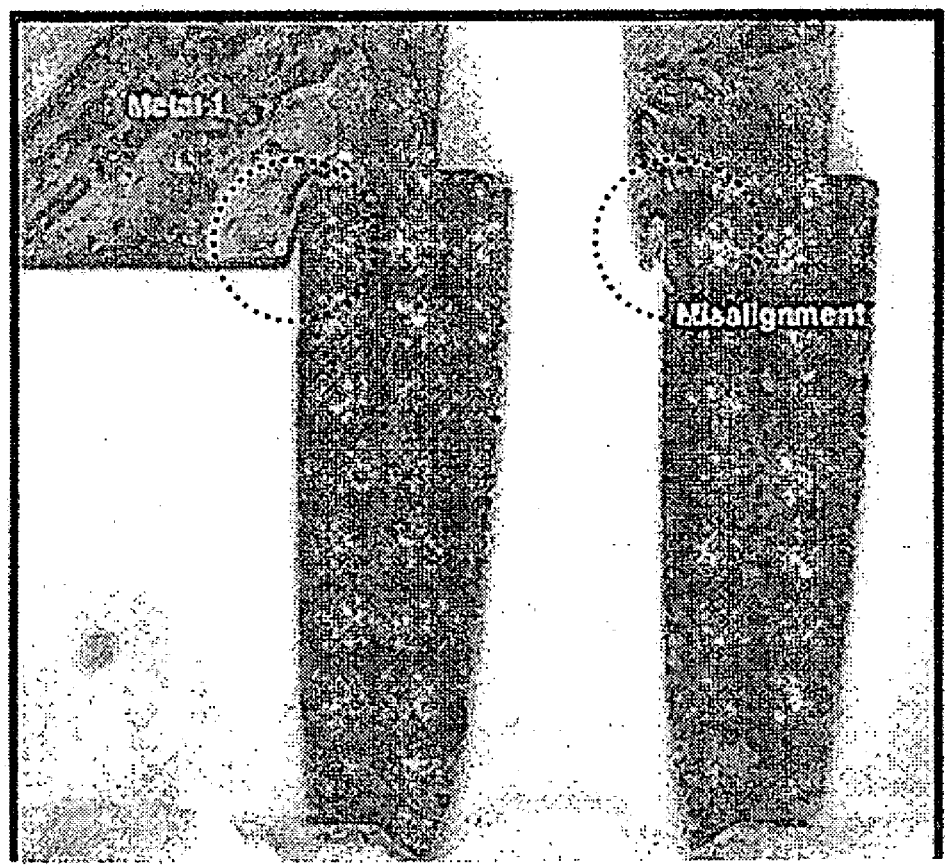
FIG. 7 is a transmission electron microscope (TEM) photograph for explaining parasitic spacers generated in the related art.

Referring to FIG. 5, after the third interlayer insulation film 32 is deposited as shown in FIG. 4, a photoresist is deposited on top of the whole structure, and then an exposure process and a development process are sequentially performed so that a phtoresist pattern 34 is formed as an etching mask for forming trenches by which partially exposes the third interlayer insulation film 32. Subsequently, an etching process is performed by using the photoresist pattern 34 as an etching mask to form trenches 36. In the aforementioned etching process, the etch-stopping layer 22 can be used as a barrier, which makes it possible to perform over-etching. As a consequence, it is possible to prevent occurrence of parasitic spacers (in the circles shown in FIG. 7). In other words, the first interlayer insulation film 20, the etch-stopping layer 22, and the second interlayer insulation film 24 are sequentially deposited as shown in FIG. 1, and then they are sufficiently over-etched by using the etch-stopping layer 22 as a barrier during the etching process for forming the trenches 36. In this case, the etch-stopping layer 22 restrains the etching in downward direction but promotes the etching in side walls during the etching process for forming the trenches 36. For this reason, parasitic spacers are not generated in these portions. By such processes, it is possible to obtain configuration of the trench 36 as shown in FIG. 5.

Figure 6:
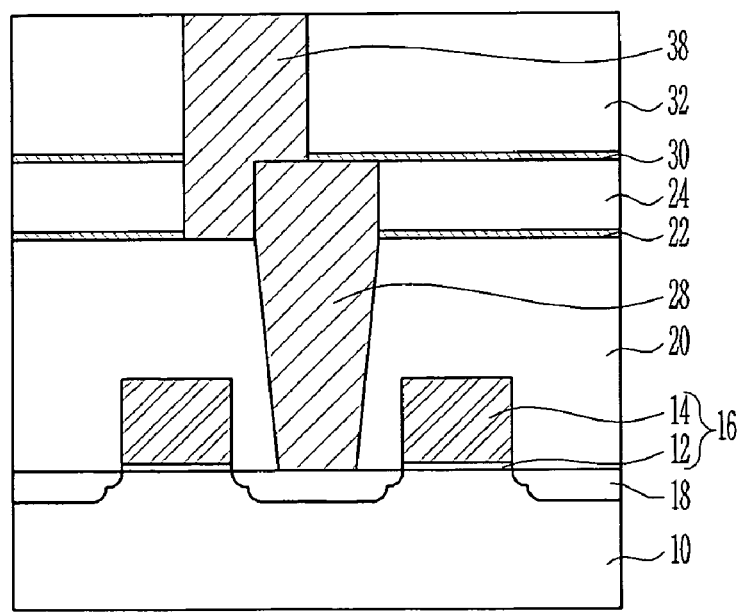

Referring to FIG. 6, a second barrier film (not shown) is formed on the inside surfaces (i.e., side and bottom surfaces) of the trench 36 after the trench 36 is formed as shown in FIG. 5. For example, the second barrier film is made up of the same material as the first barrier film. In other words, the second barrier film may be a single-layered film made up of one material selected from a group of materials consisting of Ta, TaN, TaAlN, TaSiN, $TaSi_2$, Ti, TiN, TiSiN, WN, Co, and $CoSi_2$, or a double-layered film laminated by using the above materials. Then, a metal line 38 is formed to bury the trench. Preferably, the metal line 38 is made up of copper. Besides, it is possible to use one material selected from a group of materials consisting of aluminum (Al), platinum (Pt), palladium (Pd), rubidium (Ru), strontium (St), rhodium (Rh), and cobalt (Co). In this case, the metal line 38 may be formed by using an electrical plating method. The electrical plating method is performed in such a way that a seed layer (not shown) is formed on the second barrier film and then copper is deposited on it by using the seed layer as a seed. Then, a planarization process using a CMP method is performed to planarize the copper layer, which buries the trench. As a result, it is possible to form a metal line 38.

As described above, according to the present invention, an etch-stopping layer is deposited between the interlayer insulation films, and then over-etching is performed by using the etch-stopping layer as an etching barrier during the etching process for forming the subsequent trenches. Therefore, it is possible to prevent occurrence of parasitic spacers in the trenches.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a metal line in a semiconductor device, comprising:
    (a) sequentially forming a first interlayer insulation film, an etch-stopping layer, and a second interlayer insulation film on a semiconductor substrate having a predetermined semiconductor structural layer;
    (b) forming a contact hole which partially exposes the semiconductor structural layer by performing an etching process using an etching mask for the contact hole;
    (c) forming a metal plug to bury the contact hole;
    (d) sequentially forming an anti-diffusion film and a third interlayer insulation film on the semiconductor device including the metal plug;
    (e) performing an etching process using an etching mask for a trench to form the trench in such a way that the second interlayer insulation film is over-etched by using the etch-stopping layer as an etching barrier; and
    (f) forming a metal line to bury the trench.

2. The method of claim 1, wherein the etch-stopping layer is composed of SiC, SiN, or SiON.

3. The method of claim 1, wherein the first interlayer insulation film and the second interlayer insulation film are formed by depositing BPSG, PSG, USG, or FSG, or by a film in which fluorine, hydrogen, boron, or phosphorous is locally diffused into SiO or $SiO_2$ in a substitutional or interstitial manner.

4. The method of claim 1, wherein the etching process in the step (b) is performed by using a $C_xH_yF_z$ gas (wherein x is any natural number, y is 0 or any natural number, and z is 0 or any natural number, and wherein both y and z do not become 0 simultaneously) as a main etchant gas and an inert gaseous atom or a molecule of $O_2$, $N_2$, $SF_6$, Ar, or He as an additive gas.

* * * * *